United States Patent [19]

Pae et al.

[11] 4,349,502
[45] Sep. 14, 1982

[54] FABRICATION METHOD FOR UNORIENTED PHASE-I PVF$_2$

[75] Inventors: Kook D. Pae, East Brunswick; Brian A. Newman, Highland Park; Jerry I. Scheinbeim, Somerset, all of N.J.

[73] Assignee: The United States of America as represented by the Secretary of the Navy, Washington, D.C.

[21] Appl. No.: 200,172

[22] Filed: Oct. 24, 1980

[51] Int. Cl.$^3$ .............................................. B29C 25/00
[52] U.S. Cl. ....................................... 264/320; 264/22; 264/235; 264/331.14
[58] Field of Search .................... 264/22, 320, 331.14, 264/235

[56] References Cited

U.S. PATENT DOCUMENTS

| 2,854,699 | 10/1958 | Robb | 264/331.14 |
| 3,691,264 | 9/1972 | Asahina | 264/22 |
| 4,241,128 | 12/1980 | Wang | 264/22 X |

OTHER PUBLICATIONS

"Ferroelectricity in Polyvinylidine Fluoride", R. G. Kepler et al., J. Appl. Phys. 49(3), pp. 1232–1235, Mar. 1978.

"Nuclear Magnetic Resonance & X-ray Determination of the Structure of Poly(Vinylidene Fluoride)", J. B. Lando, J. Polymer Sci., vol. 4, part A-1, pp. 941–951 (1966).

"Piezoelectricity, Pyroelectricity, and the Electrostriction Constant of Poly(Vinylidene Fluoride)", K. Nakumura, J. Polymer Sci., Part A-2, vol. 9, pp. 161–173 (1971).

Primary Examiner—Thomas P. Pavelko
Attorney, Agent, or Firm—R. S. Sciascia; P. C. Lall

[57] ABSTRACT

Fabrication of unoriented phase I crystalline PVF$_2$ is described wherein commercially available PVF$_2$ phase II (crystalline form) is placed in a high pressure cell and its temperature is raised slightly over its melting point. The sample is then subjected to abrupt changes in high pressure and the temperature is dropped thereafter. The pressure is then reduced resulting in a product which contains both phase I and phase II forms of PVF$_2$. The phase I content of the product varies from a few percent and up depending upon the pressure applied during the quenching step.

7 Claims, 3 Drawing Figures

FABRICATION METHOD FOR UNORIENTED PHASE-I PVF$_2$

BACKGROUND OF THE INVENTION

This invention relates to piezoelectric materials and, more particularly, to fabrication of polyvinylidene fluoride (PVF$_2$) including unoriented phase I crystallites which has desirable piezoelectric characteristics for it to be used in acoustic transducers.

Since the initial discovery of the large piezoelectric response of poled, oriented films of PVF$_2$ by Kawai in 1969, several subsequent studies have been made to elucidate the mechanisms responsible for this phenomenon. Since the greatest piezoelectric activity is found for PVF$_2$ films with the phase I crystal structure, it is desirable to find a satisfactory explanation to account for this feature. Mechanisms most often discussed are: a bulk polarization of the sample due to field induced reorientation or switching of the molecular dipoles in the polar phase I crystals; non-uniform charge injection leading to an asymmetric distribution of real charge in the sample; a field induced charge in trapping of injected or ionic charges present as impurities; and some type of surface phenomenon caused by the strong interaction between the positive electrode and the film during poling. Regardless of the mechanism accounting for the piezoelectric activity of PVF$_2$ in the phase I crystal structure, it is desirable to have a simple technique of fabricating this material to exploit it for use in acoustic transducers.

SUMMARY OF THE INVENTION

The objects and advantages of the present invention are accomplished by utilizing a method of fabricating PVF$_2$ in the phase I crystal structure by using a commercially available PVF$_2$ phase II. The method used to accomplish this objective is usually termed as pressure quenching (crystallization caused by rapidly increasing pressure) of molten PVF$_2$. Work samples are cut from the unoriented, melt-pressed, films and the exposed film edges are coated with a thin layer of epoxy. The samples are then subjected to high pressure. The sample is then melted using a steady-state heating rate. The material is then subjected to a much higher pressure in a very short time interval. Immediately after the increase in pressure, crystallization of the sample is observed. The sample is then cooled and the pressure is reduced to atmospheric pressure. By varying initial pressure and final pressure, various samples are obtained which contained various percentages of PVF$_2$ phase I and PVF$_2$ phase II crystalline material. The samples are then poled using a poling field below the threshold value so as to produce no observable changes in the x-ray diffraction patterns taken before and after poling. After poling the sample, piezoelectric constants are measured and the contribution from PVF$_2$ phase I crystalline structure is studied.

An object of subject invention is to have a technique of fabricating PVF$_2$ phase I crystalline structure.

Another object of the subject invention is to fabricate PVF$_2$ phase I crystalline structure from commercially available PVF$_2$ phase II crystalline structure.

Still another object of the subject invention is to have PVF$_2$ phase I crystalline structure for acoustic transducer use.

Another object of the subject invention is to obtain optimum parameters under which PVF$_2$ phase II samples can be transformed into PVF$_2$ phase I crystalline structure.

Other objects, advantages and novel features of the invention will become apparent from the following detailed description of the invention when considered in conjunction with the accompanying drawing wherein:

DESCRIPTION OF A PREFERRED EMBODIMENT

The method of fabricating PVF$_2$ phase I crystalline structure according to the teachings of subject invention involved preparing work samples from 25 micron ($25 \times 10^{-6}$ meters), capacitor grade, Kureha film of PVF$_2$. It should be noted that any equivalent capacitor grade of PVF$_2$ can also be used without deviating from the teachings of subject invention. To remove the biaxial orientation of the as-received film, it was sandwiched between aluminum foil sheets and melted in a press at 210° C. and kept at 130° C. for 15 minutes thereafter. The stress applied to the samples by a press was approximately 2000 psi (pounds per square inch). However, 25 micron steel shim stock was placed between the pressure plates to maintain the original thickness of the sample. Actual thickness of the samples varied from 23 to 25 microns. Wide-angle diffractometer scans, taken in both reflection and transmission modes, of samples prepared in this manner showed no evidence of crystallite orientation.

For pressure quenching thin strips, preferably of 1 cm width, the film sandwiched in aluminum sheets were cut from the unoriented melt-pressed films and the exposed film edges were coated with a thin layer of epoxy. After allowing the epoxy to set, the samples were placed inside the high pressure differential thermal analysis (DTA) cell. The pressure medium, preferably silicon oil, was added and some of the sample was melted onto the sample thermocouple junction, and the cell was sealed. The aluminum and epoxy surrounding the film samples effectively prevented diffusion of the pressure medium (silicon oil) into the samples and thus had a negligible effect in terms of altering the state of hydrostatic stress (pressure) to which the samples were subjected. The high-pressure system was then pumped up to some predetermined initial pressure, P$_i$ and the DTA cell was heated externally. The steady-state heating rate, determined from the sample thermocouple was approximately 8° C. per minute. Just before sample melting occurred, the DTA pressure vessel was isolated from the rest of the high-pressure system by closing a valve in the high pressure line between the DTA cell and the pressure intensifier. The high-pressure system (intensifier) was then pumped up to some much higher pressure. When the sample had clearly melted, as indicated by the DTA thermogram, the valve was quickly opened and the pressure in the DTA cell rapidly (i.e.

less than 0.1 second) was increased to a final pressure $P_f$. Immediately after the increase in pressure from $P_i$ to $P_f$ in the DTA cell, sample crystallization occurred as indicated by the DTA thermogram. The DTA cell was then cooled to approximately 40° C. by replacing the external heaters with water cooled copper coils and the pressure was reduced to atmospheric pressure and the samples were then removed.

Figure 1:
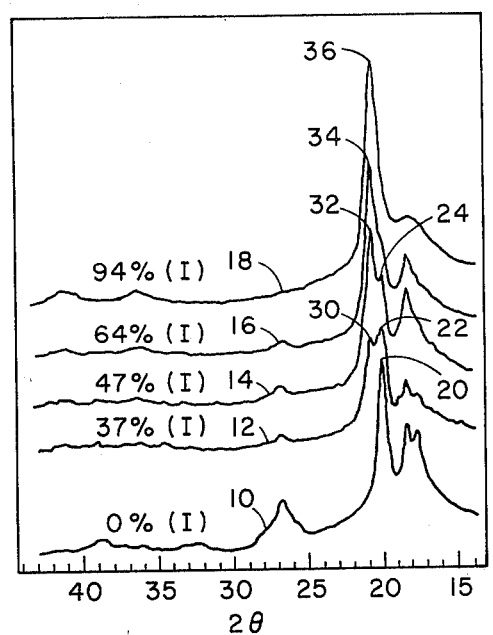
FIG. 1 is a graphical representation of wide-angle diffractometer scans of samples containing different percentages of phase I crystalline PVF$_2$ material.
Figure 2:
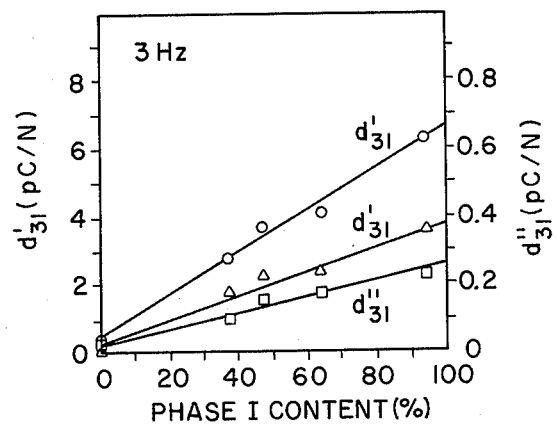
FIG. 2 is a graphical representation of variation of piezoelectric stress constant ($d_{31}$*) as a function percentage of PVF$_2$ phase I crystalline structure in the sample.
Figure 3:
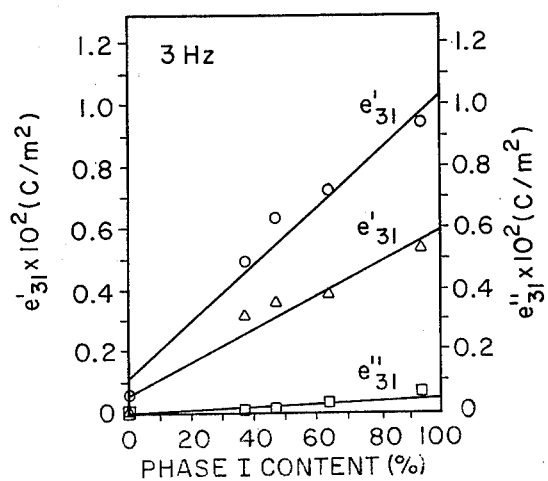
FIG. 3 is a graphical representation of piezoelectric strain constant $e_{31}$*) as a function of percentage of PVF$_2$ phase I crystalline material present in the sample.

A measure of the volume fraction of phase I and phase II crystallites present in the pressure-quenched samples was determined from the wide-angle diffractometer scans using CuK$\alpha$ radiation. As shown in FIG. 1, x-ray intensity was plotted against the values of refracted angle in wide-angle diffractometer scans. Curves 10, 12, 14, 16 and 18 show different diffractometer scans of samples containing different percentages in phase I PVF$_2$ crystalline material. Peaks 20, 22, 24 correspond to phase II of PVF$_2$ crystalline material whereas peaks 30, 32, 34 and 36 correspond to phase I PVF$_2$ crystallite material. As can be seen, the peaks due to phase II PVF$_2$ crystalline material start fading and peaks due to phase I PVF$_2$ crystalline material start appearing with the increase in percentage of phase I PVF$_2$ crystalline material and the decrease in the percentage of phase II PVF$_2$ crystalline material. The samples so obtained were prepared for poling by evaporating gold electrodes on both sides. The samples were then placed in the poling apparatus which included two polished copper plates connected to a high voltage supply. The apparatus was then placed under high vacuum and the chamber pressure was reduced to approximately $10^{-5}$ Torr and the samples were poled for preferably one hour at $10^6$ volts/cm with poling temperatures between 21° C. and 23° C. The poling field was chosen to be below the threshold value of $1.2 \times 10^6$ volts per centimeter at which significant changes in wide-angle diffractometer scans were observed after poling. Thus the poling field was kept at $10^6$ volts/cm to avoid the difficulty of determining the effects of field-induced changes in crystallite orientation and polymorphic crystal form. No measurable change in sample crystallinity during poling was observed. Dynamic piezoelectric strain constant ($d_{31}^*$ having a real component $d_{31}'$ and imaginary component $d_{31}''$) and stress constant ($e_{31}^*$ having a real component $e_{31}'$ and an imaginary component $e_{31}''$) measurements and dynamic mechanical modulus and dielectric measurements were made at 3 hertz (H$_z$) using a Toyo Seiki, Piezotron U, Dynamic Piezo-Electricity Analyzer. The results of these measurements are shown in FIGS. 2 and 3. As can be seen, the value of piezoelectric stress constant ($e_{31}^*$) and piezoelectric strain constant ($d_{31}^*$) increase appreciably with the increase in percentage of phase I PVF$_2$ crystalline structure.

The initial pressure $P_i$ and final pressure $P_f$ were varied in order to determine phase I content (percentage) crystallinity and crystallization pressures shown on the following page in Table 1.

From FIGS. 1 through 3, it can be seen that phase I PVF$_2$ crystalline structure is obtainable by using the technique of subject invention, i.e. pressure quenching of molten PVF$_2$.

TABLE 1

Phase I content (%), % Crystallinity, and Crystallization Pressures of the Samples.

| Phase I Content (%) | Percent Crystallinity | $P_i$ | $P_f$ |
|---|---|---|---|
| 0 | 53 | 1 atm. | 1 atm. |
| 37 | 51 | 1.6 Kb | 2.7 Kb |
| 47 | 54 | 1.6 Kb | 6.4 Kb |
| 64 | 52 | 1.7 Kb | 6.5 Kb |
| 94 | 51 | 2.0 Kb | 6.6 Kb |

Briefly stated, phase I PVF$_2$ crystalline structure is obtained by using pressure quenching of molten phase II PVF$_2$. According to this method, samples of capacitor grade PVF$_2$ are subjected to sudden pressure variations in order to obtain varying percentages of phase I PVF$_2$ crystalline structure in the samples.

Obviously, many modifications and variations of the present invention are possible in the light of the above teachings. As an example, different types of PVF$_2$ samples including oriented film, unoriented film and bulk form can be used. Furthermore, pressure and temperature and heating and cooling rates can be changed to optimize conditions to obtain a high percentage of phase I PVF$_2$ crystalline structure. It is, therefore, to be understood that within the scope of the appended claims, the invention may be practiced otherwise than as specifically described.

What is claimed is:

1. A method for converting a predominantly phase II PVF$_2$ sample into PVF$_2$ phase I crystalline structure which includes the steps of:
   placing said PVF$_2$ sample in a high pressure cell;
   applying high pressure at least 2 kilobars to said sample in said high pressure cell;
   heating said sample in said high pressure cell to bring the temperature thereof close to a melting point of said PVF$_2$ sample;
   increasing rapidly the high pressure applied to said PVF$_2$ sample to a second predetermined value in a predetermined short time interval;
   cooling said sample in said high pressure cell; and reducing pressure applied to said sample to atmospheric pressure.

2. The method of claim 1 wherein the step of heating said unoriented PVF$_2$ sample is at a steady rate of 8° C. per minute.

3. The method of claim 1 wherein the step of increasing rapidly the high pressure applied to said unoriented PVF$_2$ sample includes said second predetermined value of 6.6 kilobars.

4. The method of claim 3 wherein the step of increasing rapidly the high pressure applied to said unoriented PVF$_2$ sample to said second predetermined value includes said predetermined short time interval of 0.1 second.

5. The method of claim 1 which further includes a step of forming an unoriented melt-pressed film from said PVF$_2$ sample prior to the steps of claim 1.

6. The method of claim 5 wherein the step of claim 2 for making an unoriented melt-pressed film from said PVF$_2$ sample further includes using a pair of aluminum foils a fixed distance apart for keeping said unoriented melt-pressed film of a uniform thickness.

7. The method of claim 6 wherein the step of claim 2 for making an unoriented melt-pressed film further includes applying pressure of 2000 psi to the melted sample of PVF$_2$.

* * * * *